United States Patent
Sjölund et al.

(10) Patent No.: US 9,891,024 B2
(45) Date of Patent: Feb. 13, 2018

(54) DEVICE FOR THERMAL ADAPTION

(71) Applicant: BAE Systems Hägglunds Aktiebolag, Örnsköldsvik (SE)

(72) Inventors: Peder Sjölund, Örnsköldsvik (SE); Jussi Myllyluoma, Sollentuna (SE)

(73) Assignee: BAE Systems Hägglunds Aktiebolag, Örnsköldsvik (SE)

( * ) Notice: Subject to any disclaimer, the term of this patent is extended or adjusted under 35 U.S.C. 154(b) by 541 days.

(21) Appl. No.: 14/543,128

(22) Filed: Nov. 17, 2014

(65) Prior Publication Data
US 2015/0198423 A1 Jul. 16, 2015

Related U.S. Application Data

(63) Continuation of application No. 13/145,099, filed as application No. PCT/SE2010/050162 on Feb. 11, 2010, now Pat. No. 9,028,137.

(30) Foreign Application Priority Data

Feb. 11, 2009 (SE) ...................... 0950071

(51) Int. Cl.
*G01N 25/18* (2006.01)
*G01N 25/20* (2006.01)
(Continued)

(52) U.S. Cl.
CPC .............. *F41H 3/00* (2013.01); *B60N 2/5678* (2013.01); *H01L 35/30* (2013.01)

(58) Field of Classification Search
CPC ........ G01N 25/18; G01N 25/20; G01K 17/00; B60N 2/5678; F41H 3/00
(Continued)

(56) References Cited

U.S. PATENT DOCUMENTS

| 480,113 A | 8/1892 | Miller | |
| 3,387,134 A * | 6/1968 | Treharne | G01J 5/20 |
| | | | 250/349 |

(Continued)

FOREIGN PATENT DOCUMENTS

| CA | 2599652 A1 | 9/2006 |
| FR | 2826188 A1 | 12/2002 |

(Continued)

OTHER PUBLICATIONS

International Search Report and Written Opinion received for PCT Patent Application No. PCT/SE2010/050162, dated Apr. 20, 2010, 14 pages.

(Continued)

*Primary Examiner* — Gail Kaplan Verbitsky
(74) *Attorney, Agent, or Firm* — Morrison & Foerster LLP

(57) ABSTRACT

The invention relates to a device for thermal adaptation, comprising at least one surface element arranged to assume a determined thermal distribution, said surface element comprising a first heat conducting layer, a second heat conducting layer, said first and second heat conducting layers being mutually thermally isolated by means of an intermediate insulation layer, wherein at least one thermoelectric element is arranged to generate a predetermined temperature gradient to a portion of said first layer. The invention also relates to an object such as a craft.

18 Claims, 8 Drawing Sheets

(51) Int. Cl.
*F41H 3/00* (2006.01)
*B60N 2/56* (2006.01)
*H01L 35/30* (2006.01)

(58) Field of Classification Search
USPC .............................................................. 342/3
See application file for complete search history.

(56) References Cited

U.S. PATENT DOCUMENTS

| | | | |
|---|---|---|---|
| 3,680,374 | A | 8/1972 | Sumikama |
| 3,733,887 | A | 5/1973 | Stanley et al. |
| 4,717,786 | A * | 1/1988 | Thery ..................... G01K 7/02 |
| | | | 136/211 |
| 5,622,430 | A * | 4/1997 | Pletka .................... G01N 25/18 |
| | | | 374/44 |
| 6,338,292 | B1 | 1/2002 | Reynolds et al. |
| 6,443,003 | B1 | 9/2002 | Bailis |
| 6,482,520 | B1 | 11/2002 | Tzeng |
| 7,102,814 | B1 | 9/2006 | Hughes |
| 9,618,402 | B2 * | 4/2017 | Kwon .................... G01K 17/00 |
| 2002/0000443 | A1 * | 1/2002 | Hunter ............... B65D 81/3813 |
| | | | 220/592.26 |
| 2002/0136261 | A1 * | 9/2002 | Naka ...................... G01N 25/18 |
| | | | 374/44 |
| 2004/0157717 | A1 | 8/2004 | Oh et al. |
| 2005/0052310 | A1 | 3/2005 | Snaper |
| 2005/0199067 | A1 * | 9/2005 | Caps ....................... G01L 21/10 |
| | | | 73/708 |
| 2006/0086118 | A1 | 4/2006 | Venkatasubramanian et al. |
| 2008/0229759 | A1 | 9/2008 | Ouyang et al. |
| 2014/0125506 | A1 * | 5/2014 | Sjolund ..................... F41H 3/00 |
| | | | 342/3 |
| 2015/0359135 | A1 * | 12/2015 | Cavallaro ............ H05K 7/2039 |
| | | | 361/679.03 |

FOREIGN PATENT DOCUMENTS

| | | |
|---|---|---|
| JP | 7-120197 A | 5/1995 |
| JP | 2000-172347 A | 6/2000 |
| JP | 2003-318452 A | 11/2003 |
| JP | 2004-79883 A | 3/2004 |
| JP | 2005-27485 A | 4/2009 |
| WO | 96/11372 A1 | 4/1996 |
| WO | 2006/113607 A1 | 9/2006 |
| WO | 2008/018072 A2 | 2/2008 |
| WO | 2008/018072 A3 | 4/2009 |
| WO | 2008/018072 A4 | 6/2009 |

OTHER PUBLICATIONS

International Preliminary Report on Patentability received for PCT Patent Application No. PCT/SE2010/050162, dated Aug. 25, 2011, 10 pages.
Office Action received for Korean Patent Application No. 10-2011-7021326, dated Feb. 29, 2016, 17 pages (9 pages of English Translation and 8 pages of Official copy).
Office Action Received for Canadian Patent Application No. 2,751,749 dated Sep. 3, 2015, 5 pages.
Extended European Search Report received for European Patent Application No. 15180960.5, dated Dec. 1, 2015, 5 pages.
Intention to Grant received for European Patent Application No. 15180960.5, dated Nov. 10, 2016, 6 Pages.
Office Action received for Canadian Patent Application No. 2,751,749, dated Aug. 2, 2016, 4 pages.
Decision to Grant received for European Patent Application No. 15180960.5, dated Mar. 9, 2017, 2 pages.
Extended European Search Report (includes European Search Report and Search Opinion) received for European Patent Application No. 17156999.9, dated Mar. 17, 2017, 9 pages.
International Search Report and Written Opinion received for PCT Patent Application No. PCT/SE2010/050162, dated Apr. 20, 2010, 13 pages.
Office Action received for Chinese Patent Application No. 201080006788.7, dated Jun. 18, 2013, 14 pages (9 pages of English Translation and 5 pages of Official Copy).
Extended European Search Report (includes Supplementary European Search Report and Search Opinion) received for European Patent Application No. 10741486.4, dated Apr. 2, 2014, 16 pages.
Written Opinion received for Singapore Patent Application No. 201104942-6, dated Aug. 30, 2012, 6 pages.
Final Office Action received for U.S. Appl. No. 13/145,099, dated May 28, 2014, 8 pages.
Non-Final Office Action received for U.S. Appl. No. 13/145,099, dated Feb. 6, 2014, 10 pages.
Notice of Allowance received for U.S. Appl. No. 13/145,099, dated Sep. 8, 2014, 7 pages.
Norley et al., "The Development of a Natural Graphite Heat-Spreader", Seventeenth IEEE Semi-Therm Symposium, Mar. 2001, pp. 107-110.
Smalc et al., "Thermal Performance of Natural Graphite Heat Spreaders", Proceedings of IPACK2005, ASME InterPACK '05, Jul. 17-22, 2005, pp. 1-11.

* cited by examiner

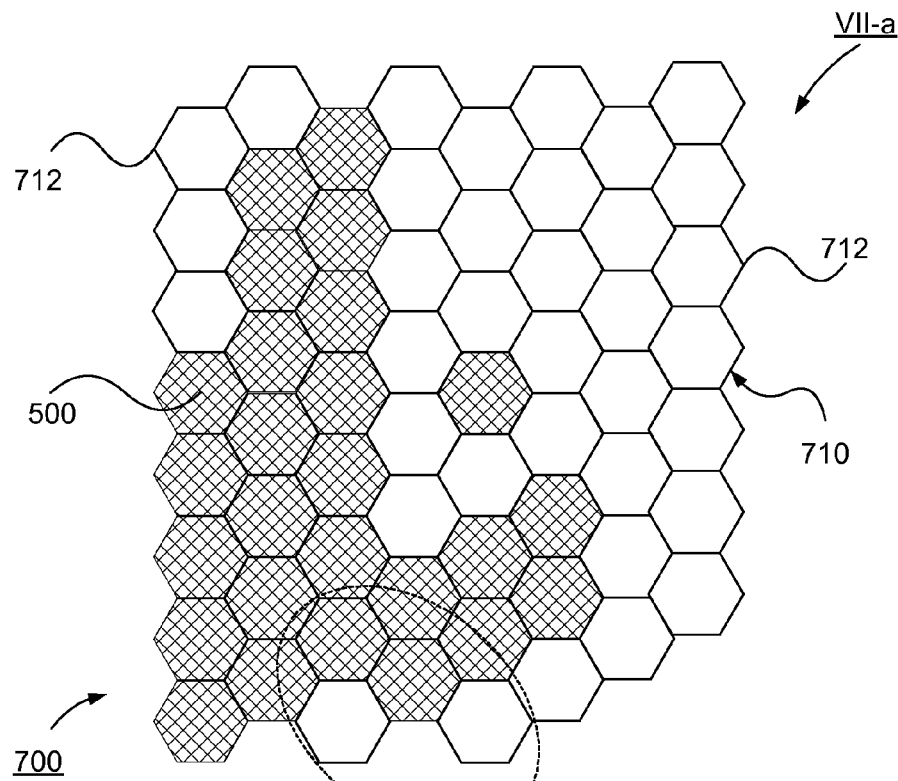
Fig. 7a
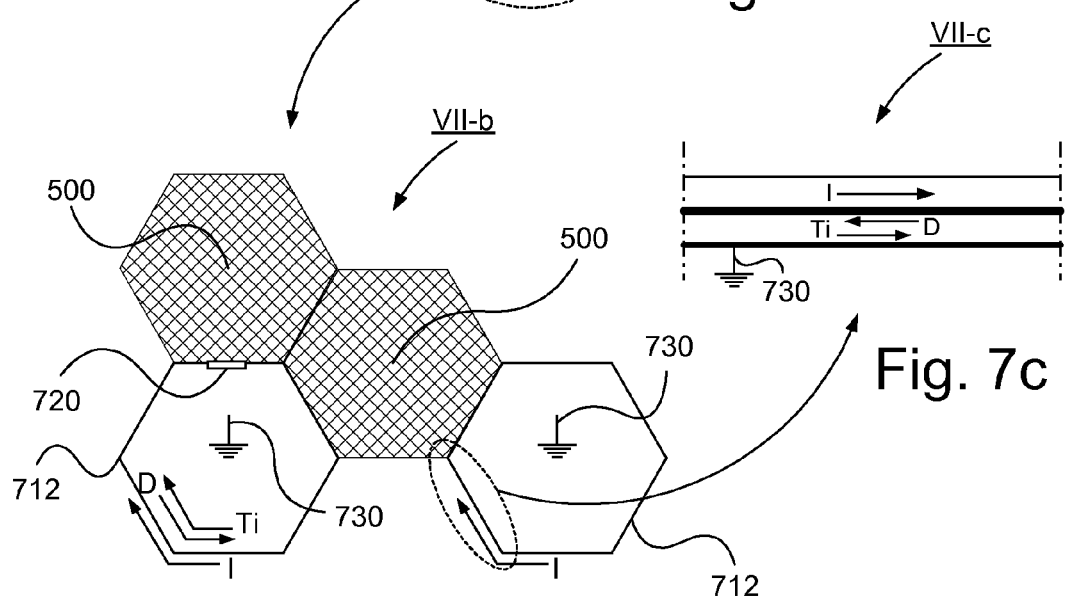
Fig. 7b
Fig. 7c

US 9,891,024 B2

DEVICE FOR THERMAL ADAPTION

CROSS REFERENCE TO RELATED APPLICATIONS

This is a continuation application of U.S. application Ser. No. 13/145,099, filed Oct. 14, 2011, which is a U.S. National Phase patent application of PCT/SE2010/050162, filed Feb. 11, 2010, which claims priority to Swedish Patent Application No. 0950071-1, filed Feb. 11, 2009, each of which is hereby incorporated by reference in the present disclosure in its entirety.

TECHNICAL FIELD

The present invention relates to a device for thermal adaptation according to the preamble in claim 1. The present invention also relates to an object such as a vehicle.

BACKGROUND

Military vehicles/crafts are subjected to threats, e.g. in a situation of war, constituting targets for attack from land, air and sea. It is therefore desired that the vehicle is as difficult as possible to detect, classify and identify. For this purpose military vehicles are often camouflaged to the background to avoid detection, classification and identification from the bare eye. Further, they are hard to detect in darkness with different types of image intensifiers. A problem is that attacking crafts such as combat vehicles and aircrafts often are equipped with heat seeking means in which advanced thermal camera system systems are used wherein the vehicles/crafts become relatively easy targets. Users of such IR-systems search for a certain type of thermal contour normally not occurring in nature, usually different edge geometries, and/or large evenly heated surfaces.

In order to protect against such systems different types of techniques are at present used in the area of signature adaptation. Signature adaptation techniques comprises constructional actions and are often combined with advanced material techniques in order to provide an apparent projection of low thermal contrast the vehicles/crafts in such IR-systems.

In FR2826188 thermo-luminescent molecules in shifting layers for camouflaging in among others the thermal range of wavelengths. A problem with such a solution is that it is difficult to achieve in practice. Further, this can not occur with automatic adaptation to a background.

U.S. Pat. No. 480,113 discloses a device where the surface of an aeroplane is heated by conducting a current through metal wires such that they thermally fit to the temperature of the background, wherein an evenly heated surface being an average value of the background is achieved, complicating discovery of the aeroplane, which otherwise would constitute a cold contrast for a hostile aeroplane above this. This solution does not consider camouflaging by means of cooling but only by means of heating, and results in an evenly heated thermal structure, which sophisticated IR-systems would be able to identify.

OBJECTS OF THE INVENTION

An object of the present invention is to provide a device for thermal adaptation which is quick and efficient.

An additional object of the present invention is to provide a device for thermal adaptation which facilitates providing thermal camouflaging with desired thermal structure.

An additional object of the present invention is to provide a device for thermal camouflaging which facilitates providing automatic thermal adaptation of the surrounding and facilitates providing an uneven thermal structure.

Another object of the present invention is to provide a device for thermally imitating e.g. other vehicles/crafts in order to provide thermal identification of own troops or to facilitate thermal infiltration in or around e.g. enemy troops during suitable circumstances.

SUMMARY OF THE INVENTION

These and other objects, apparent from the following description, are achieved by a device for thermal adaptation and an object, which are of the type stated by way of introduction and which in addition exhibits the features recited in the appended claims.

According to the invention the objects are achieved by a device for thermal adaptation, comprising at least one surface element arranged to assume a determined thermal distribution, said surface element comprising a first heat conducting layer, a second heat conducting layer, said first and second heat conducting layer being mutually thermally isolated by means of an intermediate insulation layer, wherein at least one thermoelectric element is arranged to generate a predetermined temperature gradient to a portion of said first layer.

Hereby is facilitated an efficient thermal adaptation. The device may be used in a countless number of applications such as cooling bag for efficient dispersal of the cold, during cooling of electronic components where heat from large surfaces may be efficiently diverted by means of the device during calibration of IR-camera in order to achieve stable temperature references. The device generally facilitates making the Peltier-technique more efficient. The device may be arranged in the soles of shoes for cooling or heating. The device may be utilized for cooling or heating of seats for climate control. The device may be used in combination with solar cells in order to make utilization of solar energy more efficient, the device partly recovering excessive heat which finally may increase efficiency in solar cells. The device facilitates thermal barriers by interconnection of module elements such that different stable temperatures may be kept on different surfaces. A certain application of the present invention is thermal adaptation for camouflaging of e.g. military vehicles, wherein the heat conducting layers together with the insulation layer facilitates quick heat transport and diversion of heat such that thermal adaptation may occur during movement of the vehicle. An additional particular application of the present invention is the construction of thermal objects by composition of module elements. This in order to create decoys for training and education of military personnel for tactical use of thermal camera and sensor systems.

According to an embodiment of the device said first layer and said second layer have anisotropic heat conduction such that heat conduction mainly occurs in the main direction of propagation of the respective layer. By means of the anisotropic layers a quick and efficient transport of heat is facilitated and consequently quick and efficient adaptation. By increasing ratio between heat conduction in the main direction of propagation of the layer and heat conduction crosswise to the layer it is facilitated to arrange the thermoelectric elements at a larger distance from each other in a device with e.g. several interconnected surface elements, which results in a cost efficient composition of surface elements. By increasing the ratio between the heat conductibility along the layer and the heat conductibility crosswise to the layer the layers may be made thinner and still achieve the same efficiency, alternatively make the layer and thus the surface element quicker. If the layers become thinner with retained efficiency, they also become cheaper and lighter.

According to an embodiment of the device said first layer and/or said second layer is composed of graphite with anisotropic properties. With such graphite efficient diversion of heat and consequently quick and efficient thermal adaptation is facilitated. Hereby heat or cold may be dispersed quickly on a large surface with relatively few thermoelectric elements, wherein temperature gradients and hot spots are reduced.

According to an embodiment of the device the thermoelectric element is arranged in the insulation layer.

According to an embodiment the device further comprises an intermediate heat conducting element arranged in the insulation layer between the thermoelectric element and the second heat conducting layer, and has anisotropic heat conduction such that heat conduction mainly occurs crosswise to the main direction of propagation of the second heat conducting layer.

According to an embodiment of the device the surface element has a hexagonal shape. This facilitates simple and general adaptation and assembly during composition of surface elements to a module system. Further an even temperature may be generated on the entire hexagonal surface, wherein local temperature differences which may occur in corners of e.g. a squarely shaped module element are avoided.

According to an embodiment the device further comprises a third heat conducting layer in the shape of a heat pipe/heat plate arranged to divert heat from the second heat conducting layer. The advantage of using layers of heat pipe/heat plate is that they have a very efficient thermal conductibility, considerably higher than e.g. conventional copper. The heat pipe/heat plate together with the heat conducting layers facilitates quick dispersal of excessive heat from the underside of the surface element to an underlying material due to their good ability to distribute the heat on large surfaces.

According to an embodiment the device further comprises an outer layer of aluminium arranged externally to the first heat conducting layer. The aluminium layer has en efficient conduction of cold and heat and is robust and durable which results in a good outer protection and consequently is suitable for cross-country vehicles.

According to an embodiment of the device the insulation layer includes a vacuum based layer. A vacuum based layer results in good isolation and further has a flexible configuration for different applications, and therefore fulfils many valuable aspects where volume and weight are important. This also results in the advantage that all types of air borne sounds are absorbed.

Lower acoustic level may thereby be achieved such that air born sounds from objects such as motor, fans or the like of e.g. a vehicle on which the device may be arranged for thermal camouflaging of the vehicle may be reduced.

According to an embodiment the device further comprises a temperature sensing means arranged to sense outer temperature of the surface element. This facilitates thermal adaptation of the surface of the surface element. Thereby present information about the outer temperature of the surface element is achieved such that suitable adaptation may be performed by means of the thermoelectric element for adaptation of the thermal surrounding.

According to an embodiment the device further comprises a thermal sensing means arranged to sense the surrounding temperature, e.g. thermal background. This gives information for adaptation of outer temperature of the surface element.

According to an embodiment of the device said thermal sensing means comprises at least one IR-camera arranged to sense the thermal structure of the background. This provides an almost perfect adaptation of the thermal structure of the background, temperature variations of the background being representable on e.g. a vehicle arranged with several interconnected surface elements. The resolution of the IR-camera may be arranged to correspond to the resolution being representable by the interconnected surface elements, i.e. that each surface element corresponds to a number of grouped camera pixels. Hereby a very good representation of the background temperature is achieved such that e.g. heating of the sun, spots of snow, pools of water, different properties of emission etc. of the background often having another temperature than the air may be represented correctly. This efficiently counteracts that clear contours and evenly heated surfaces are created such that when the device is arranged on a vehicle a very good thermal camouflaging of the vehicle is facilitated.

According to an embodiment of the device said thermal sensing means comprises at least one IR-sensor member. Hereby a more correct value of the background temperature than by only using temperature sensor is achieved and it is more cost efficient than using an IR-camera.

According to an embodiment of the device said thermal sensing means comprises at least one temperature sensor. A temperature sensor has the advantage that it is cost efficient.

According to an embodiment the device further comprises means for determining temperature difference between surrounding temperature and outer temperature of the surface element wherein said generated temperature gradient is based upon said difference. Hereby information for thermal adaptation of the surface of the surface element is achieved in accordance with the background temperature/the thermal structure of the background.

According to an embodiment the device further comprises a support structure arranged to support surface elements, wherein the support structure is arranged to supply electric current to electrically engage surface elements. As a result of the support structure per se being arranged to deliver current, the number of wires may be reduced.

According to an embodiment of the device the surface element has a thickness in the range of 5-40 mm, preferably 15-25 mm. This facilitates a light and efficient device.

According to an embodiment of the device the first heat conducting layer and the second heat conducting layer respectively has a thickness in the range of 0.1-2.5 mm, preferably 0,4-07 mm, and the insulation layer a thickness in the range of 4-30 mm, preferably 10-20 mm. This facilitates a light and efficient device.

DESCRIPTION OF THE DRAWINGS

A better understanding of the present invention will be had upon the reference to the following detailed description when read in conjunction with the accompanying drawings, wherein like reference characters refer to like parts throughout the several views, and in which:

FIG. 7a schematically illustrates a plan view of a module system comprising elements for recreating thermal background or similar according to an embodiment of the present invention;

FIG. 7b schematically illustrates an enlarged part of the module system I FIG. 7a;

FIG. 7c schematically illustrates an enlarged part of the part in FIG. 7b;

DETAILED DESCRIPTION OF THE INVENTION

Herein the term "link" is referred to as a communication link which may be a physical line, such as an opto-electronic communication line, or a non-physical line, such as a wireless connection, e.g. a radio link or microwave link.

By thermoelectric element in the embodiments according to the present invention described below is intended an element by means of which Peltier effect is provided when voltage/current is applied thereon. The thermoelectric element may also be referred to as Thermo-Electric Module (TEM).

Figure 1:
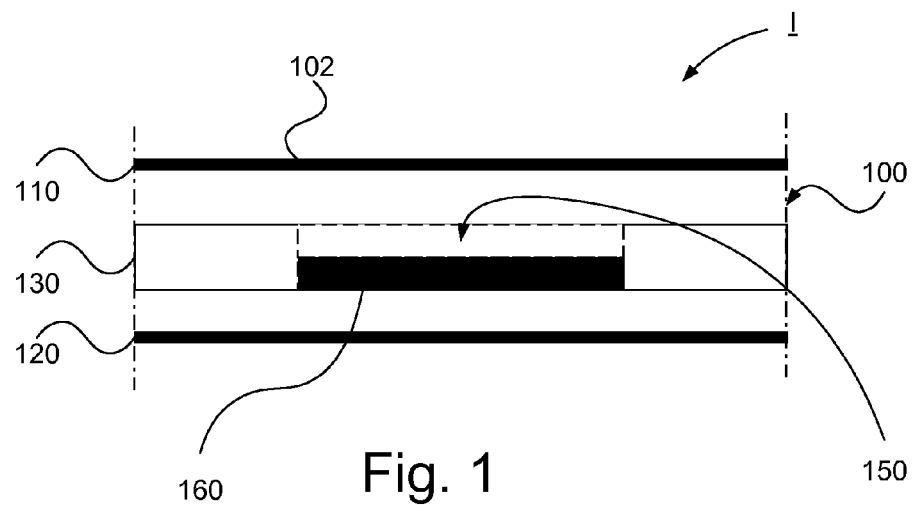
FIG. 1 schematically illustrates an exploded view of different layers of a part of a device according to an embodiment of the present invention.

FIG. 1 schematically illustrates an exploded side view of a part I of a device for thermal adaptation according to an embodiment of the present invention.

The device comprises a surface element 100 arranged to assume a determined distribution, said surface element 100 comprising a first heat conducting layer 110, a second heat conducting layer 120, said first and second heat conducting layer 110, 120 are mutually heat isolating by means of an intermediate insulation layer 130, and a thermoelectric element 150 arranged to generate a predetermined temperature gradient to a portion of said first heat conducting layer 110.

The first and second heat conducting layers 110, 120 have anisotropic heat conductibility such that the heat conductibility in the main direction of propagation, i.e. along the layer 110, 120, is considerably higher than the heat conductibility crosswise to the layer 110, 120. Hereby heat or cold may be dispersed quickly on a large surface with relatively few thermoelectric elements, wherein temperature gradients and hot spots are reduced. The first heat conducting layer 110 and the second heat conducting layer 120 are according to an embodiment constituted by graphite.

One of the first heat conducting layer 110 and the second heat conducting layer 120 is arranged to be a cold layer and another one of the first heat conducting layer 110 and the second heat conducting layer 120 is arranged to be a hot layer.

The insulation layer 130 is configured such that heat from the hot heat conducting layer does not affect the cold heat conducting layer and vice versa. According to a preferred embodiment the insulation layer 130 a vacuum based layer. Thereby both radiant heat and convection heat is reduced.

The thermoelectric element 150 is according to an embodiment arranged in the insulation layer. The thermoelectric element 150 is configured in such a way that when a voltage is applied, i.e. a current is supplied to the thermoelectric element 150, heat from one side of the thermoelectric element 150 transcends to the other side of the thermoelectric element 150. The thermoelectric element 150 is consequently arranged between two heat conducting layers 110, 120, e.g. two graphite layers, with asymmetric heat conductibility in order to efficiently disperse and evenly distribute heat or cold. Due to the combination of the two heat conducting layers 110, 120 with anisotropic heat conductibility and the insulation layer 130 the surface of the surface element 100, which according to this embodiment is constituted by the surface of the first heat conducting layer 110, may by application of voltage on the thermoelectric element be quickly and efficiently adapted. The thermoelectric element 150 is in thermal contact with the first heat conducting layer 110.

According to an embodiment the device comprises an intermediate heat conducting element 160 arranged in the insulation layer 130 inside of the thermoelectric element 150 for filling the space between the thermoelectric element 150 and the second heat conducting element 120. This in order to facilitate more efficient heat conduction between the thermoelectric element 150 and the second heat conducting element 120. The intermediate heat conducting layer has anisotropic heat conductibility where the heat conduction is considerably better crosswise to the element than along the element, i.e. it is conducting heat considerably better crosswise to the layers of the surface element 100. This is apparent from FIG. 3. According to an embodiment the first intermediate element 160 is constituted by graphite with the corresponding properties as the first and second heat conducting layer 110, 120 but with anisotropic heat conduction in a direction perpendicular to the heat conduction of the first and second heat conducting layer 110, 120.

Further the insulation layer 130 could be adapted in thickness for the thermoelectric element 150 such that there is no space between the thermoelectric element 150 and the second heat conducting element 120.

The first heat conducting layer 110 has according to an embodiment a thickness in the range of 0.1-2.5 mm, e.g. 0.1-2 mm, e.g. 0.4-0.8 mm, the thickness depending among others depending on application and desired heat conduction and efficiency. The second heat conducting layer 120 has according to an embodiment a thickness in the range of 0.1-2.5 mm, e.g. 0.1-2 mm, e.g. 0.4-0.8 mm, the thickness depending among others on application and desired heat conduction and efficiency.

The insulation layer 130 has according to an embodiment a thickness in the range of 4-30 mm, e.g. 10-20 mm, the thickness depending among others on application and desired efficiency.

The thermoelectric element 150 has according to an embodiment a thickness in the range of 1-20 mm, e.g. 2-8 mm, according to a variant about 4 mm, the thickness depending among others on the application and desired heat conduction and efficiency. The thermoelectric element has according to an embodiment a surface in the range of 0.01 $mm^2$-60 $cm^2$, according to an embodiment 0.01 $mm^2$-20 $cm^2$.

The intermediate heat conducting element 160 has a thickness being adapted such that it fills the space in the space between the thermoelectric element 150 and the heat conducting layer 120.

The surface of the surface element 100 is according to an embodiment in the range of 25-2000 $cm^2$, e.g. 75-1000 $cm^2$. The thickness of the surface element is according to an embodiment in the range of 5-40 mm, e.g. 15-25 mm, the thickness depending among others on the application and desired heat conduction and efficiency.

Figure 2:
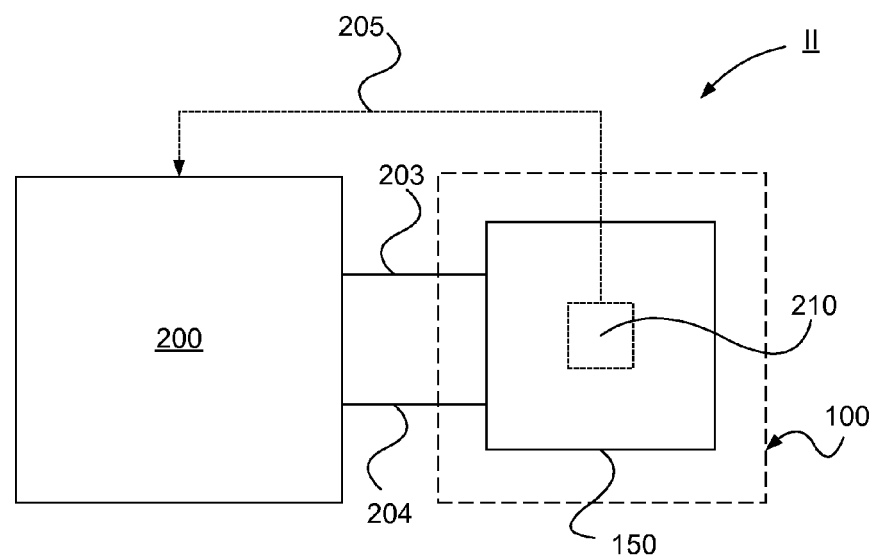
FIG. 2 schematically illustrates a device for thermal adaptation according to an embodiment of the present invention.

FIG. 2 schematically illustrates a device II for thermal adaptation according to an embodiment of the present invention.

The device comprises a control loop 200 or control unit 200 arranged and a surface element 100 e.g. according to FIG. 1 wherein the control loop 200 is connected to a surface element 100. The surface element 100 comprises a thermoelectric element 150 arranged to receive voltage/current from the control loop 200, the thermoelectric element 150 according to above being configured in such a way that when a voltage is connected, heat from one side of the thermoelectric element 150 transcends to the other side of the thermoelectric element 150. The control loop 200 is connected to the thermoelectric element via links 203, 204 for connection of voltage to the thermoelectric element 150.

The device comprises according to an embodiment a temperature sensing means 210, dotted in FIG. 2, arranged to sense the present temperature of the surface element 100. The temperature is according to a variant arranged to be compared to temperature information, preferably continuous information, from thermal sensing means of the control loop 200. Hereby the temperature sensing means is connected to control loop 200 via a link 205. The control loop is arranged to receive a signal via the link representing temperature data, wherein the control loop is arranged to compare the temperature data to temperature data from the thermal sensing means.

The temperature sensing means 210 is according to an embodiment arranged on or in connection to the outer surface of the thermoelectric element 150 such that the temperature being sensed is the outer temperature of the surface element 100. When the temperature sensed by means of the temperature sensing means 210 when compared to the temperature information from the thermal sensing means of the control loop 200 differs from the temperature information from the thermal sensing means of the control loop 200 the voltage to the thermoelectric element 150 is according to an embodiment arranged to be regulated such that the actual value and the desired value correspond, wherein the outer temperature of the surface element 100 is adapted accordingly by means of the thermoelectric element 150.

Figure 6:
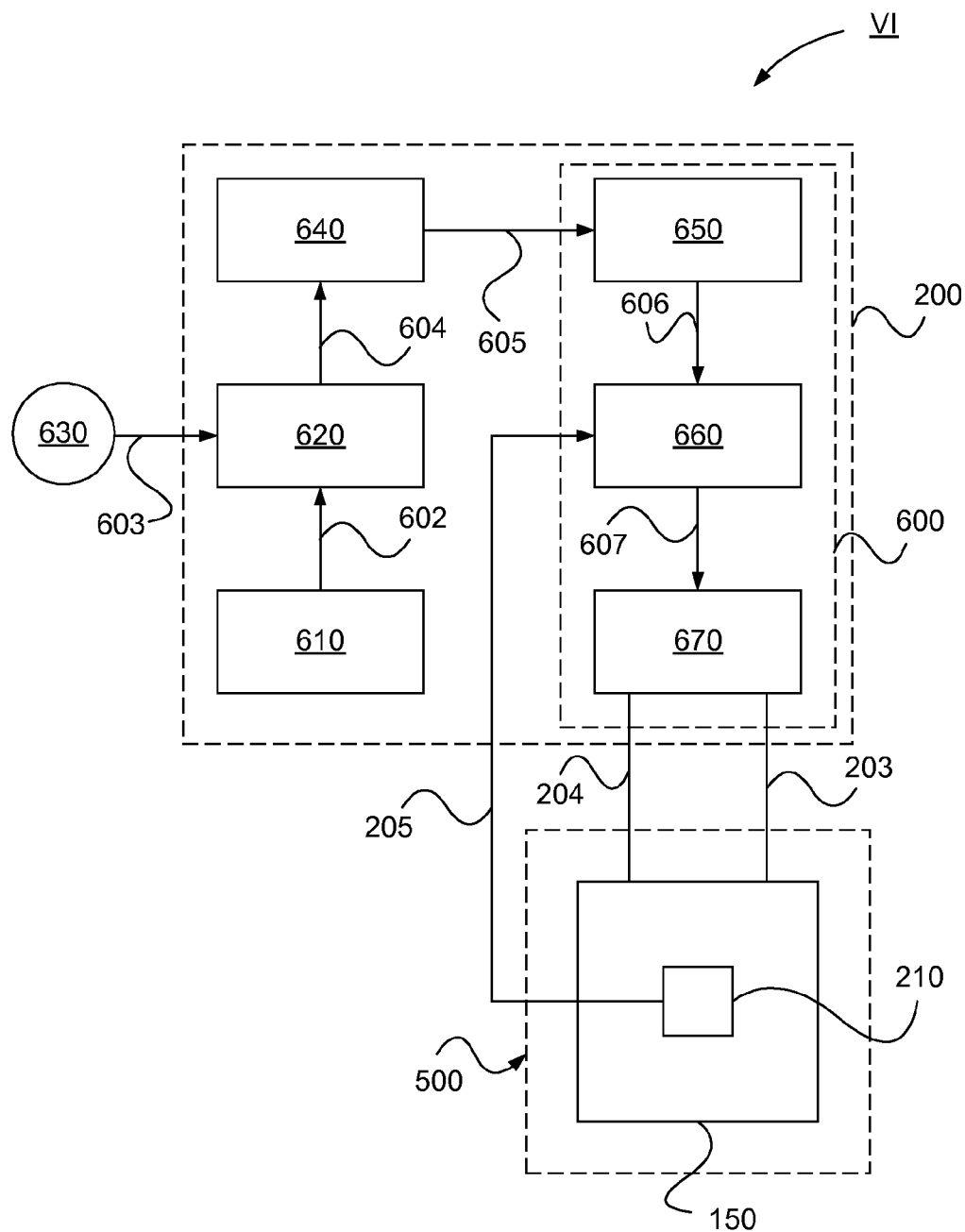
FIG. 6 schematically illustrates a device for thermal adaptation according to an embodiment of the present invention.

The design of the control loop 200 depends on application. According to a variant the control loop 200 comprises a switch, wherein in such a case voltage over the thermoelectric element 150 is arranged to be switched on or off for providing of cooling (or heating) of the surface of the surface element. FIG. 6 shows the control loop according to an embodiment of the invention, the device according to the invention being intended to be used for thermal camouflaging of e.g. a vehicle.

Figure 3:
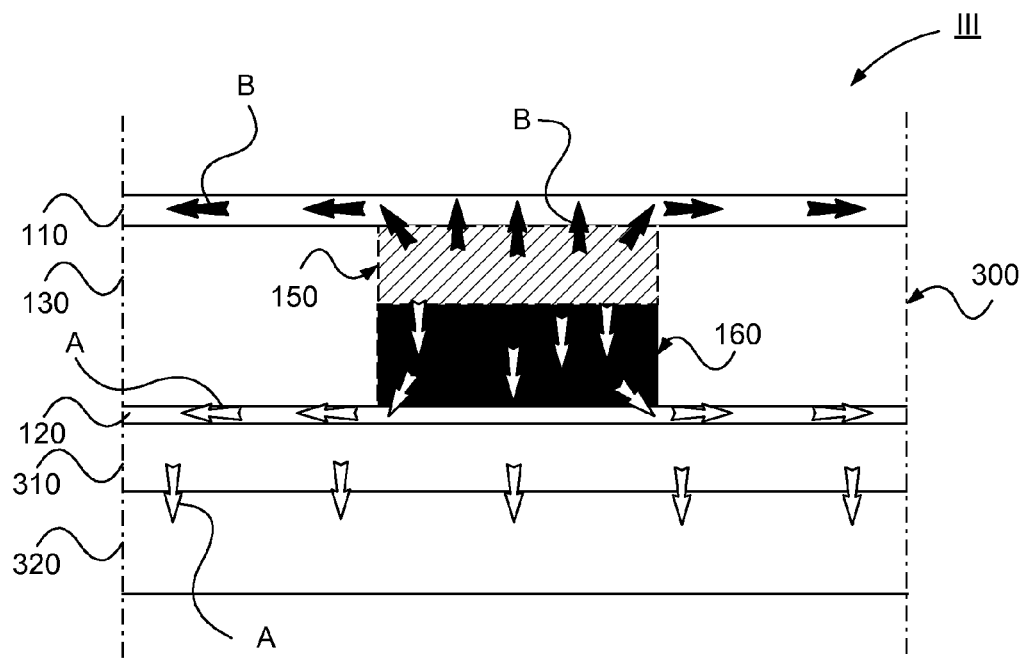
FIG. 3 schematically illustrates heat transportation in a device according to an embodiment of the present invention.

FIG. 3 schematically illustrates heat transport in a device III according to an embodiment of the present invention.

the device comprises a surface element 300 arranged to assume a determined thermal distribution, said surface element comprising a first heat conducting layer 110, a second heat conducting layer 120, said first and second heat conducting layers being mutually thermally isolated by means of an intermediate insulation layer 130, and a thermoelectric element 150 arranged to generate a predetermined temperature gradient to a portion of said first heat conducting layer 110. The device also comprises an intermediate heat conducting element 160, e.g. as described in connection to FIG. 1.

Figure 5A:
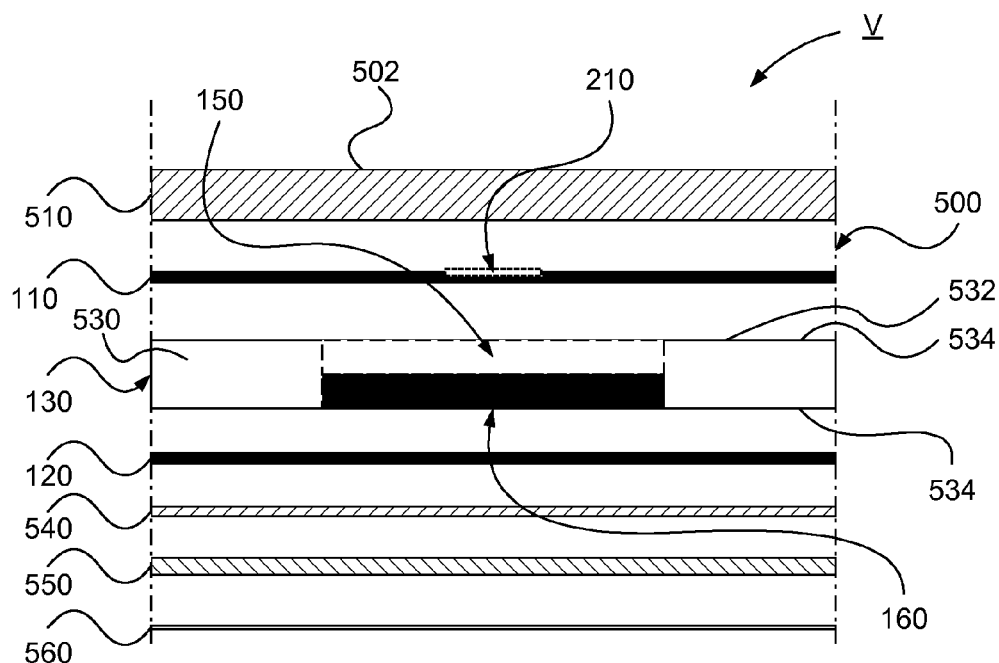
FIG. 5a schematically illustrates an exploded view of different layers of a part of a device according to an embodiment of the present invention.

The surface element 100 according to certain embodiments, see e.g. FIG. 5a, comprises layers for e.g. applying of a surface element 100 to a vehicle. Here a third layer 310 and a fourth layer 320 are arranged for further diversion of heat and/or thermal contact to surface of e.g. vehicles.

As apparent from FIG. 3 the heat is transported from one side of the thermoelectric element 150 and transcends to the other side of the thermoelectric element and further through the intermediate heat conducting layer 160, heat transport being illustrated with white arrows A or non-filled arrows A and transport of cold is illustrated with black arrows B or filled arrows B, transport of cold physically implies diversion of heat having the opposite direction to the direction for transport of cold. Here it is apparent that the first and second heat conducting layer 110, 120, which according to an embodiment are constituted by graphite, have anisotropic heat conductibility such that the heat conductibility in the main direction of propagation, i.e. along the layer, is considerably higher than the heat conductibility crosswise to the layer. Hereby heat or cold may be dispersed quickly on a large surface with relatively few thermoelectric elements and relatively low supplied power, whereby temperature gradients and hot spots are reduced. Further an even and constant desired temperature may be kept during a longer time.

Heat is transported further through the third layer 310 and the fourth layer 320 for diversion of heat.

Figure 4:
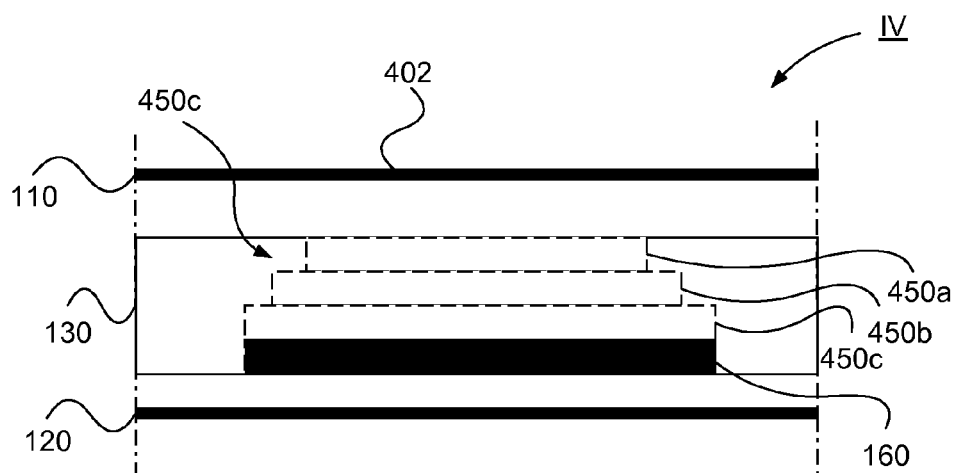
FIG. 4 schematically illustrates an exploded view of a part of a device for thermal adaptation according to an embodiment of the present invention.

FIG. 4 schematically illustrates an exploded view of a part IV of a device for thermal adaptation according to an embodiment of the present invention.

The device according to this embodiment differs form the embodiment according to FIG. 1 only by the fact that it instead of a thermoelectric element comprises three thermoelectric elements arranged on top of each other.

The device comprises a surface element 400 arranged to assume a thermal distribution, said surface element 400 comprising a first heat conducting layer 110, a second heat conducting layer 120, said first and second heat conducting layers 110, 120 being mutually thermally isolated by means of an intermediate insulation layer 130, and a thermoelectric element configuration 450 arranged to generate a predetermined temperature gradient to a portion of said first heat conducting layer 110.

According to an embodiment the device comprises an intermediate heat conducting layer 160 arranged in the insulation layer 130 inside of the thermoelectric element 150 to fill possible space between the thermoelectric element configuration 450 and the second heat conducting element 120. This such that heat conduction may occur more efficiently between the thermoelectric element configuration 450 and the second heat conducting element 120. The intermediate heat conducting element 160 has anisotropic heat conductibility, the heat conduction being considerably better crosswise to than along the element, i.e. conducts heat considerably better crosswise to the layers of the surface element 400, in accordance with what is illustrated in FIG. 3.

The thermoelectric element configuration 450 comprises three thermoelectric elements 450a, 450b, 450c arranged on top of each other. A first thermoelectric element 450a being arranged outermost in the insulation layer of the surface element 400, a second thermoelectric element 450b, and a third thermoelectric element 450c being arranged innermost, wherein the second thermoelectric element 450b is arranged between the first and the third thermoelectric element.

When voltage is applied as the outer surface 402 of the surface element 400 is intended to be cooled heat is transported by means of the first thermoelectric element 450a from the surface and toward the second thermoelectric element 450b. The second thermoelectric element 450b is arranged to transport heat from its outer surface towards the third thermoelectric element 450c such that the second thermoelectric element 450b contributes to transporting excessive heat away from the first thermoelectric element 450a. The third thermoelectric element 450c is arranged to transport heat from its outer surface towards the second heat conducting layer 120, via the intermediate heat conducting element 160, such that the third thermoelectric element 450c contributes in transporting excessive heat away from the first and second thermoelectric elements.

Hereby a voltage is applied over the respective thermoelectric element 450a, 450b, 450c.

Here an intermediate heat conducting element is arranged between the thermoelectric element configuration 450 and the second heat conducting element 120. Alternatively the thermoelectric element configuration 450 is arranged to fill the entire insulation layer such that no intermediate heat conducting element is required.

The respective thermoelectric element 450a, 450b, 450c has according to an embodiment a thickness in the range of 1-20 mm, e.g. 2-8 mm, according to a variant about 4 mm, the thickness depending among others on application and desired heat conduction and efficiency.

The insulation layer 130 according to an embodiment has a thickness in the range of 4-30 mm, e.g. 10-20 mm, the thickness depending among other on application and desired efficiency.

By using three thermoelectric elements arranged on top of each other as in this example, the net efficiency of heat transported away becomes higher than by using only on thermoelectric element. Hereby diversion of heat is rendered more efficient. This may e.g. be required during intense heat from the sun in order to efficiently divert heat.

Alternatively two thermoelectric elements arranged on top of each other may be used, or more than three thermoelectric elements arranged on top of each other.

FIG. 5a schematically illustrates an exploded side view of a part V of a device for thermal adaptation according to an embodiment of the present invention suitable for using on e.g. a military vehicle for thermal camouflaging.

The device comprises a surface element 500 also referred to as module element 500 arranged to assume a determined thermal distribution, said module element 500 comprising a first heat conducting layer 110, a second heat conducting layer 120, said first and second heat conducting layers 110, 120 being mutually thermally isolated by means of an intermediate insulation layer 130, and a thermoelectric element 150 arranged to generate a predetermined temperature gradient to a portion of said first heat conducting layer 110.

The module element 500 constitutes according to a variant a part of the device which is interconnected by module elements, the module elements according to an embodiment being constituted by module elements according to FIG. 5a, wherein the module element forms a module system as shown in FIG. 7a-c for application on e.g. a vehicle.

The module element 500 according to this embodiment comprises an outer layer 510. The layer is composed of a material with efficient heat conductibility for conducting heat or cold from an underlying layer in order to facilitate representing the thermal structure, which according to an embodiment is a copy of the thermal background temperature. According to an embodiment the outer layer 510 is made of aluminium or steel, which have an efficient thermal conductibility and are robust and durable which results in a good outer protection and consequently renders suitable for cross country vehicles.

The first heat conducting layer 110, which according to a preferred embodiment is constituted by graphite, is arranged under the outer layer 510. The second heat conducting layer 120 or inner heat conducting layer 120 is according to a preferred embodiment constituted by graphite.

The first heat conducting layer 110 and the second heat conducting layer 120 have anisotropic heat conductibility. Thus, the first and the second heat conducting layers respectively has such a composition and such properties that the longitudinal heat conductibility, i.e. heat conductibility in the main direction of propagation along the layer is considerably higher than the transversal heat conductibility, i.e. the heat conductibility crosswise to the layer, the heat conductibility along the layer being good. These properties are facilitated by means of graphite layers with layers of pure carbon, which is achieved by refinement such that higher anisotropy of the graphite layers is achieved. Hereby heat may be dispersed quickly on a large surface with relatively few thermoelectric elements, whereby temperature gradients and hot spots are reduced.

According to a preferred embodiment the ratio between longitudinal heat conductibility and transversal heat conductibility of the layer 110, 120 is greater than hundred. With increasing ratio it is facilitated to having the thermoelectric elements arranged on a larger distance from each other, which results in a cost efficient composition of module elements. By increasing the ratio between the heat conductibility along the layer 110, 120 and heat conductibility crosswise to the layers 110, 120 the layers may be made thinner and still obtain the same efficiency, alternatively make the layer and thus the module element 500 thermally quicker.

One of the first and second heat conducting layers 110, 120 is arranged to be a cold layer and another of the first and second heat conducting layers 110, 120 is arranged to be a hot layer. According to an application e.g. for camouflaging of vehicles, the first heat conducting layer 110, i.e. the outer of the heat conducting layers, is the cold layer.

The graphite layers 110, 120 has according to a variant a composition such that the heat conductibility along the graphite layer lies in the range of 500-1500 W/mK and the heat conductibility crosswise to the graphite layer is in the range of 1-10 W/mK, according to an embodiment 1-5 W/mK.

According to an embodiment the module element 500 comprises an intermediate heat conducting element 160 arranged in the insulation layer 130 inside of the thermoelectric element 150 to fill possible space between the thermoelectric element 150 and the second heat conducting element 120. This such that heat conducting may occur more efficiently between the thermoelectric element 150 and the second heat conducting element 120. The intermediate heat conducting element has anisotropic heat conductibility wherein the heat conduction is considerably better along the layers than crosswise to the layers of the surface element 100. This is apparent from FIG. 3. According to an embodiment the intermediate heat conducting element 160 is constituted by graphite with corresponding properties as of the first and second heat conducting layer 110, 120 but with anisotropic heat conduction in a direction perpendicular to the heat conduction of the first and second heat conducting layers 110, 120.

The insulation layer 130 for thermal isolation is arranged between the first heat conducting layer 110 and the second heat conducting layer 120. The insulation layer 130 is configured such that heat from the hot heat conducting layer 110, 120 minimally affects the cold heat conducting layer 120, 110 and vice versa. The insulation layer 130 considerably improves performance of the module element 500/device. The first heat conducting layer 110 and the second heat conducting layer 120 are mutually thermally isolated by means of the intermediate insulation layer 130. The thermoelectric element 150 is in thermal contact with the first heat conducting layer 110.

According to a preferred embodiment the insulation layer 130 is a vacuum based element 530 or a vacuum based layer 530. Hereby both radiant heat and convection heat are reduced due to interaction between material, which is relatively high in conventional insulation materials having a high degree of confined air, i.e. porous materials such as foam, glass fibre fabric, or the like, occurs to a very low degree, the air pressure being in the range of hundred thousand times lower than conventional insulation materials.

According to an embodiment the vacuum based element 530 is covered with high reflection membranes 532. Thereby transport of heat in the form of electromagnetic radiation, which does not need to interact with material for heat transportation, is counteracted.

The vacuum based element 530 consequently results in very good isolation, and further has a flexible configuration for different applications, and thereby fulfils many valuable aspects where volume and weight are important. According to an embodiment the pressure in the vacuum based element lies in the range of 0.005 and 0.01 torr. This also results in the advantage that all types of airborne sounds may be absorbed. Lower acoustic level may thereby be achieved such that an airborne sound from an object such as a motor, fans or the like of e.g. a vehicle on which the device may be arranged may be reduced.

According to an embodiment the insulation layer 130 comprises screens 534 or layers 534 with low emission arranged to considerably reduce the part of the heat transport occurring through radiation. According to an embodiment the insulation layer 130 comprises a combination of vacuum based element 530 and low emissive layers 534 in a sandwich construction. This gives a very efficient heat isolator and may give values of thermal conductivity as good as 0.004 W/mK.

The module element 500 further comprises a temperature sensing means 210, which according to an embodiment is constituted by a thermal sensor. The temperature sensing means 210 is arranged to sense the present temperature. According to a variant the temperature sensing means 210 is arranged to measure a voltage drop through a material being arranged outermost on the sensor, said material having such properties that it changes resistance depending on temperature. According to an embodiment the thermal sensor comprises two types of metals which in their boundary layers generate a weak voltage depending on temperature. This voltage arises from the Seebeck-effect. The magnitude of the voltage is directly proportional to the magnitude of this temperature gradient. Depending on which temperature range measurements are to be performed different types of sensors are more suitable than others, where different types of metals generating different voltages may be used. The temperature is then arranged to be compared to continuous information from a thermal sensing means arranged to sense/copy the thermal background, i.e. the temperature of the background. The temperature sensing means 210, e.g. a thermal sensor, is fixed on the upper side of the first heat conducting layer 110 and the temperature sensing means in the form of e.g. a thermal sensor may be made very thin and may according to an embodiment be arranged in the first heat conducting layer, e.g. the graphite layer, in which a recess for countersinking of the thermal sensor according to an embodiment is arranged.

The module element 500 further comprises the thermoelectric element 150. The thermoelectric element 150 is according to an embodiment arranged in the insulation layer 130. The temperature sensing means 210 is according to an embodiment arranged in layer 110 and in close connection to the outer surface of the thermoelectric element 150 wherein the thermoelectric element 150 is configured in such a way that when a voltage is applied, heat from one side of the thermoelectric element 150 transcends into the other side of the thermoelectric element 150. When the by means of the sensing means 210 sensed temperature when compared to the temperature information from the thermal sensing means differs from the temperature information, the voltage to the thermoelectric element 150 is arranged to be regulated such that actual values correspond, wherein the temperature of the module element 500 is adapted accordingly by means of the thermoelectric element 150.

The thermoelectric element is according to an embodiment a semiconductor functioning according to the Peltier effect. The Peltier effect is a thermoelectric phenomena arising when a dead current is allowed to float over different metals or semiconductors. In this way a heat pump cooling one side of the element and heating the other side may be created. The thermoelectric element according to this variant further comprises semiconductor rods which are positively doped in one end and negatively doped in the other end such that when a current is flowing though the semiconductor, electrons are forced to stream such that one side becomes hotter and the other side colder (deficiency of electrons). During change of direction of current, i.e. by changed polarity of the applied voltage, the effect is the opposite, i.e. the other side becomes hot and the first cold. This is the so called Peltier effect, which consequently is being utilized in the present invention.

The module element 500 further comprises a support layer 540 arranged inside of the second heat conducting layer 120. The support layer 540 is arranged to support the module element 500. The support layer 540 is a rigid layer which prevents the module element from becoming to soft.

The module element 500 further comprises a heat conducting layer 550 in the form of a heat pipe layer or heat plate layer arranged inside the support layer 540 for dispersing heat for efficiently divert excessive heat. The third heat conducting layer 550, i.e. the heat pipe layer/heat plate layer comprises according to a variant sealed aluminium or copper with internal capillary surfaces in the shape of wicks, the wicks according to a variant being constituted by sintered copper powder. The wick is according to a variant saturated with liquid which under different processes either is vaporized or condensed. Type of liquid and wick is determined by the intended temperature range and determines the heat conductibility.

The pressure in the third heat conducting layer 550, i.e. the heat pipe layer/heat plate layer is relatively low, wherefore the specific steam pressure makes the liquid in the wick vaporizing in the point in which heat is applied. The steam in this position has a considerably higher pressure than its surrounding which results in it dispersing quickly to all areas with lower pressure, in which areas it condenses into the wick and emits its energy in the form of heat. This process is continuous until an equilibrium pressure has arisen. This process is at the same time reversible such that even cold, i.e. lack of heat can be transported with the same principle.

The advantage of using layers of heat pipes/heat plate is that they have very efficient heat conductibility, substantially higher than e.g. conventional copper. The ability to transport heat, so called Axial Power Rating (APC), is impaired with the length of the pipe and increases with its diameter. The heat pipe/heat plate together with the heat conducting layers facilitate quick dispersal of excessive heat from the underside of the module elements 500 to underlying material due to their good ability to distribute heat on large surfaces. By means of heat pipe/heat plate quick diversion of excessive heat which e.g. is required during certain sunny situations is facilitated. Due to the quick diversion of excessive heat efficient work of the thermoelectric element 150 is facilitated, which facilitates efficient thermal adaptation of the surrounding continuously.

According to this embodiment the first heat conducting layer and the second heat conducting layer are constituted by graphite layers such as described above and the third heat conducting layer is constituted by heat pipe layers/heat plate layers. According to a variant of the invention the third heat conducting layer may be omitted, which results in a slightly reduced efficiency but at the same time reduces costs. According to an additional variant the first and/or the second heat conducting layer may be constituted by heat pipe layer/heat plate layer, which increase the efficiency but at the same time increases the costs. In case the second heat conducting layer is constituted by heat pipe layer/heat plate layer the third heat conducting layer may be omitted.

The module element 500 further comprises a thermal membrane 560. The thermal membrane 560 facilitates good thermal contact on surfaces with small irregularities such as body of motor vehicles which irregularities otherwise may result in impaired thermal contact. Hereby the possibility to divert excessive heat and thus efficient work of the thermoelectric element 150 is improved. According to an embodiment the thermal membrane 560 is constituted by a soft layer with high heat conductibility which results in the module element 500 obtaining good thermal contact against e.g. the body of the vehicle, which facilitates good diversion of excessive heat.

Above, the module element 500 and its layers have been described as flat. Other alternative shapes/configurations are also conceivable.

The first heat conducting layer 110 has according to an embodiment a thickness in the range of 0.1-2.5 mm, e.g. 0.4-0.8 mm, the thickness among others depending on application and desired heat conduction and efficiency. The second heat conducting layer 120 has according to an embodiment a thickness in the range of 0.1-2.5 mm, e.g. 0.4-0.8 mm, the thickness among others depending on application and desired heat conduction and efficiency.

The insulation layer 130 has according to an embodiment a thickness in the range of 4-30 mm, e.g. 10-20 mm, the thickness among others depending on application and desired efficiency.

The thermoelectric element 150 has according to an embodiment a thickness in the range of 1-20 mm, e.g. 2-8 mm, according to a variant about 4 mm, the thickness among other depending on application and desired heat conduction and efficiency. The thermoelectric element according to an embodiment has a surface in the range of 0.01 $mm^2$-60 $cm^2$, e.g. 0.01 $mm^2$-20 $cm^2$.

The intermediate heat conducting element 160 has a thickness being adapted such that it fills the space between the thermoelectric element 150 and the second heat conducting layer 120.

The surface layer 510 according to an embodiment has a thickness in the range of 0.1-4 mm, e.g. 1.5-2 mm and depends among others on application and efficiency.

The thermal membrane 560 according to an embodiment has a thickness in the range of 0.05-1 mm, e.g. about 0.4 mm and depends among others on application.

The third heat conducting layer 550 in the shape of a heat pipe/heat plate according to above has according to an embodiment a thickness in the range of 2-8 mm, e.g. about 4 mm, the thickness among others depending on application, desired efficiency and heat conduction.

The surface of the module element/surface element 500 is according to an embodiment in the range of 25-2000 $cm^2$, e.g. 75-1000 $cm^2$. The thickness of the surface element is according to an embodiment in the range of 5-40 mm, e.g. 15-25 mm, the thickness among others depending on desired heat conduction and efficiency, and materials of the different layers.

Figure 5B:
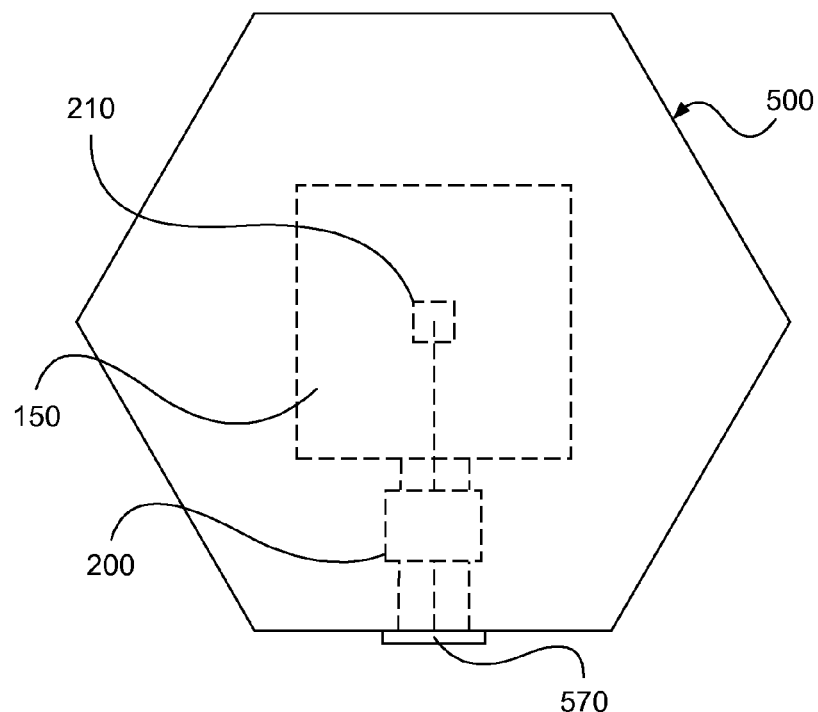
FIG. 5b schematically illustrates an exploded view of a device according to an embodiment of the present invention.

FIG. 5*b* schematically illustrates a plan view of a module element 500 according to an embodiment of the present invention.

According to this embodiment the module element 500 is hexagonally shaped. This facilitates simple and general adaptation and assembly during composition of module systems e.g. according to FIG. 7*a-c*. Further an even temperature may be generated on the entire hexagonal surface, wherein local differences in temperature may arise in corners of e.g. a squarely shaped module element may be avoided.

The module element 500 comprises a control loop 200 connected to the thermoelectric element 150 wherein the thermoelectric element 150 is arranged to generate a predetermined temperature gradient to a portion of the first heat conducting layer 110 of the module element 500 according to FIG. 5*a*, the predetermined temperature gradient being provided by means of applied voltage on the thermoelectric element 150 from the control loop, the voltage being based upon temperature data or temperature information from the control loop 200.

The module element 500 comprises an interface 570 for electrically connecting module elements for interconnection into a module system. The interface comprises according to an embodiment a connector 570.

The module element may be dimensioned as small as a surface of about 5 cm², the size of the module element being limited by the size of the control loop 200.

FIG. 6 schematically illustrates a device VI for thermal adaptation according to an embodiment of the present invention.

The device comprises a control loop 200 or control unit 200 and a surface element 500 e.g. according to FIG. 5a, 5b wherein the control loop is connected to surface elements 500. The device further comprises a thermoelectric element 150 arranged to receive voltage from the control loop 200, the thermoelectric element 150 according to above being configured in such a way that when a voltage is applied, heat from one side of the thermoelectric element 150 transcends into the other side of the thermoelectric element.

The device according to this embodiment comprises a temperature sensing means 210 arranged to sense the present temperature of the surface element 500. The temperature sensing means 210 is according to an embodiment as shown in e.g. FIG. 5a arranged on or in connection to the outer surface of the thermoelectric element 150 such that the temperature being sensed is the outer temperature of the surface element 500.

The control loop 200 comprises a thermal sensing means 610 arranged to sense temperature such as background temperature. The control loop 200 further comprises a software unit 620 arranged to receive and process temperature data from the thermal sensing means 610. The thermal sensing means 610 is consequently connected to the software unit 620 via a link 602 wherein the software unit 620 is arranged to receive a signal representing background data or ambient temperature data.

The software unit 620 is further arranged to receive instructions from a user interface 630 with which it is arranged to communicate. The software unit 620 is connected to the user interface 630 via a link 603. The software unit 620 is arranged to receive a signal from the user interface via the link 603, said signal representing instruction data, i.e. information of how the software unit 620 is to software-process temperature data form the thermal sensing means 610. The user interface 630 may e.g. when the device is arranged on e.g. a military vehicle and intended for thermal camouflaging and/or adaptation with a specific pattern of said vehicle be configured such that an operator, from an estimated direction of threat, may chose to focus available power of the device to achieve the best imaginable signature to the background. This is elucidated in more detail in FIG. 9.

According to this embodiment the control loop 200 further comprises an analogue/digital converter 640 connected via a link 604 to the software unit 620. The software unit 620 is arranged to receive a signal via the link 604, said signal representing information packages from the software unit 620 and arranged to convert the information package, i.e. information communicated from the user interface 630 and processed temperature data. The user interface 630 is arranged to determine from that or from which direction of threat that has been chosen, which IR-camera/sensor that shall deliver the information to the software unit 620. According to an embodiment all the analogue information is converted in the analogue/digital converter 640 to binary digital information via standard A/D-converters being small integrated circuits. Hereby no wires are required. According to an embodiment described in connection to FIG. 7a-c the digital information is arranged to be superposed on a current supplying framework of the vehicle.

The control loop 200 further comprises a digital information receiver 650 connected to the digital/analogue converter 640 via a link 605. From the software unit 620, information is sent analogue to the digital/analogue converter 640 where information about which temperature (desired value) each surface element shall have registered. All this is digitalized in the digital/analogue converter 640 and sent according to standard procedure as a digital sequence comprising unique digital identities for each surface element 500 with associated information about desired value etc. This sequence is read by the digital information receiver 650 and only the identity corresponding to what is pre-programmed in the digital information receiver 650 is read. In each surface element 500 a digital information receiver 650 with a unique identity is arranged. When the digital information receiver 650 senses that a digital sequence is approaching with the correct digital identity it is arranged to register the associated information and remaining digital information is not registered. This process takes place in each digital information receiver 650 and unique information to each surface element 500 is achieved. This technique is referred to as CAN technique.

The temperature control loop 600 according to this embodiment comprises the digital information receiver 650, a so called PID (Proportional Integrational Differential)-circuit 660 connected to the digital information receiver 650 via a link 606, and a regulator 670 connected via a link 607 to the PID-circuit. In the link 606 a signal representing specific digital information is arranged to be sent in order for each surface element 500 to be controllable such that desired value and actual value correspond.

The regulator 670 is then connected to the thermoelectric 150 via the links 203, 204. The temperature sensing means 210 is connected to the PID-circuit 660 via the link 205, wherein the PID-circuit is arranged via the link 205 to receive the signal representing temperature data sensed by means of the temperature sensing means 210. The regulator 570 is arranged via the link 607 to receive a signal from PID-circuit 660 representing information to increase or decrease current supply/voltage to the thermoelectric element 150.

The thermoelectric element 150 is configured in such a way that when the voltage is applied, heat from one side of the thermoelectric element 150 transcends to the other side of the thermoelectric element 150. When the temperature sensed by means of the temperature sensing means 210 by comparison with the temperature information from the thermal sensing means 610 differs from the temperature information from the thermal sensing means 610 the voltage to the thermoelectric element 150 is arranged to be regulated such that actual value and desired value correspond, wherein the temperature of the surface of the surface element 500 is adapted accordingly by means of the thermoelectric element.

According to an embodiment the thermal sensing means 610 comprises at least one temperature sensor such as a thermometer arranged to measure the temperature of the surrounding. According to another embodiment the thermal sensing means 610 comprises at least one IR-sensor arranged to measure the apparent temperature of the background, i.e. arranged to measure an average value of the background temperature. According to yet another embodiment the thermal sensing means 610 comprises at least one IR-camera arranged to sense the thermal structure of the background. These different variants of thermal sensing means described in more detail in connection to FIG. 7a-c.

FIG. 7a schematically illustrates parts VII-a of a module system 700 comprising surface elements 500 or module element to represent thermal background or corresponding; FIG. 7b schematically illustrates an enlarged part VII-b of the module system in FIG. 7a; and FIG. 7c schematically illustrates an enlarged part of FIG. 7b.

The individual temperature regulation is arranged to occur in each module element 500 individually by means of a control loop, e.g. the control loop in FIG. 6, arranged in each module element 500. Each module element 500 is according to an embodiment constituted by the module element in FIG. 5a-b.

The respective module element 500 has according to this embodiment a hexagonal shape. In FIG. 7a-b the module elements 500 are illustrated with a checked pattern. The module system 700 comprises according to this embodiment a support structure 710 configured as a framework 710 arranged to receive respective module element. The framework according to this embodiment has a honeycomb configuration, i.e. is interconnected by means of a number of hexagonal frames 712, the respective hexagonal frame 712 being arranged to receive a respective module element 500.

The framework 710 is according to this embodiment arranged to supply current. Each hexagonal frame 712 is provided with an interface 720 comprising a connector 720 by means of which the module element 500 is arranged to be electrically engaged. Digital information representing background temperature sensed by means of the thermal sensing means according to e.g. FIG. 6 is arranged to be superposed on the frame work 710. As the framework it self is arranged to supply current the number of wires may be reduced. In the framework current will be delivered to each module element 500 but at the same time also, superposed with the current, a digital sequence containing unique information for each module element 500. In this way no wires will be needed in the framework.

The framework is dimensioned for in height and surface receiving module elements 500.

A digital information receiver of respective module element such as described in connection to FIG. 6 is then arranged to receive the digital information, wherein a temperature control loop according to FIG. 6 is arranged to regulate according to described in connection to FIG. 6.

According to an embodiment the device is arranged on a craft such as a military vehicle. The framework 710 is then arranged to be fixed on e.g. the vehicle wherein the framework 710 is arranged to supply both current and digital signals. By arranging the framework 710 on the body of the vehicle the framework 710 at the same time provides fastening to the body of the craft/vehicle, i.e. the framework 710 is arranged to support the module system 700. By using the module element 500 the advantage is among others achieved that if one module element 500 would fail for some reason only the failed module element needs to be replaced. Further the module element 500 facilitates adaptation depending on application. A module element 500 may fail depending on electrical malfunctions such as short-circuits, outer affection and due to damages of shatter and remaining ammunition.

Electronics of respective module element is preferably encapsulated in respective module element 500 such that induction of electrical signals in e.g. antennas are minimized.

The body of e.g. the vehicle is arranged to function as ground plane 730 while the framework 710, preferably the upper part of the framework is arranged to constitute phase. In FIG. 7b-c I is the current in the framework, Ti a digital information containing temperatures to the module element I, and D is deviation, i.e. a digital signal telling how big difference it is between desired value and actual value for each module element. This information is sent in the opposite direction since this information should be shown in the user interface 630 according to e.g. FIG. 6 such that the user knows how good the temperature adaptation of the system is for the moment.

Figure 7D:
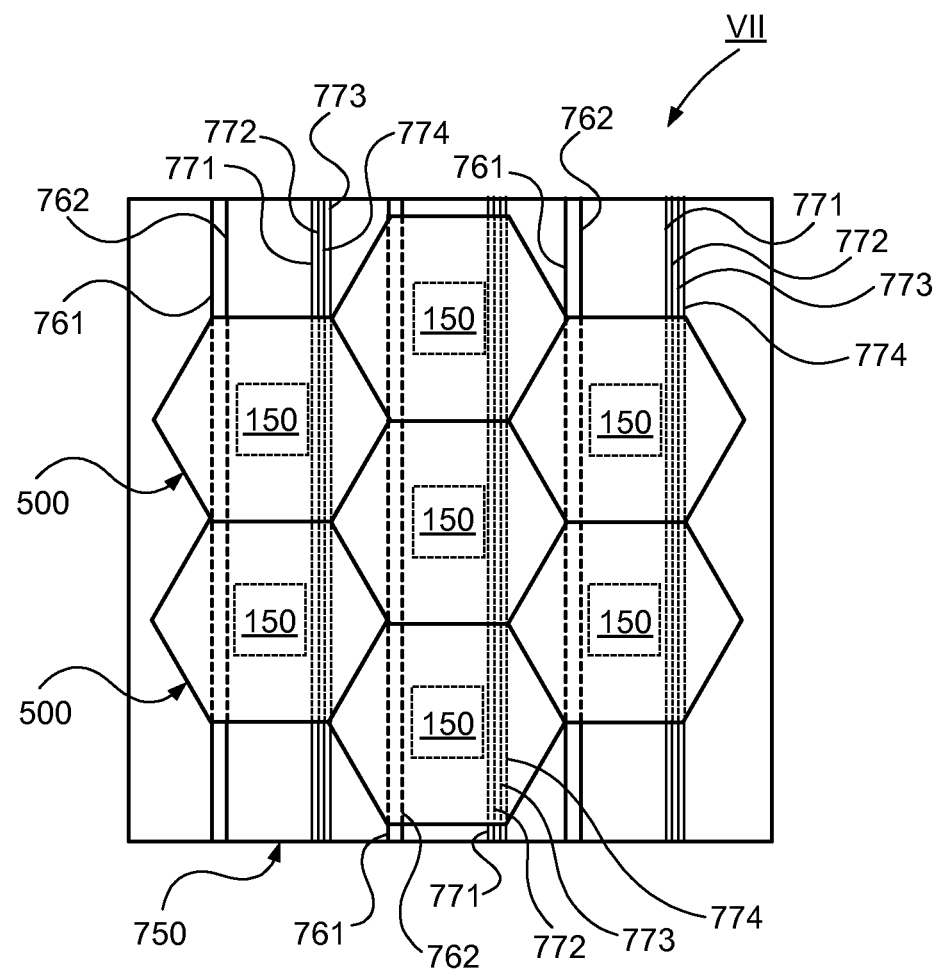
FIG. 7d schematically illustrates a plan view of a module system comprising elements for recreating thermal background or similar according to an embodiment of the present invention.
Figure 7E:
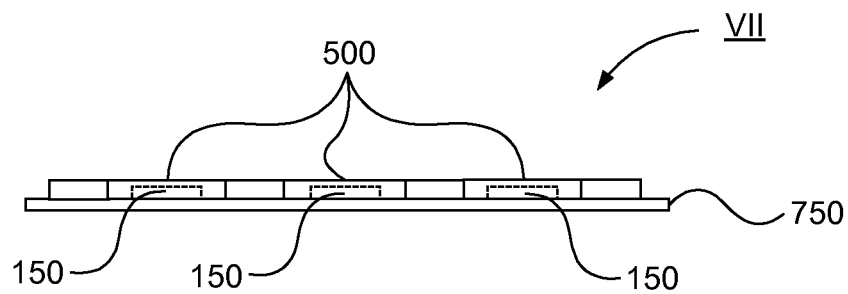
FIG. 7e schematically illustrates a side view of the module system in FIG. 7d.

FIG. 7d schematically illustrates a plan view of a module system VII or part of a module system VII comprising elements for recreating thermal background or similar according to an embodiment of the present invention, and FIG. 7e schematically illustrates a side view of the module system VII in FIG. 7d.

The module system VII according to this embodiment differs from the module element 700 according to the embodiment illustrated in FIG. 7a-c in that instead of a support structure constituted by a framework 710, a support structure 750 constituted by one or more support members 750 or support plates 750 for supporting interconnected module elements 500 is provided.

The support structure may thus be formed by one support member 750 as illustrated in FIG. 7d-e, or a plurality of interconnected support members 750 750.

The support member is made of any material fulfilling thermal demands and demands concerning robustness and durability. The support member 750 is according to an embodiment made of aluminium, which has the advantage that it is light and is robust and durable. Alternatively the support member 750 is made of steel, which also is robust and durable.

The support member 750 having a sheet configuration has according to this embodiment an essentially flat surface and a square shape. The support member 750 could alternatively have any suitable shape such as rectangular, hexagonal, etc.

The thickness of the support member 750 is in the range of 5-30 mm, e.g. 10-20 mm.

Interconnected module elements 500 comprising thermoelectric elements 150 as described above are arranged on the support member 750. The support member 750 is arranged to supply current. The support member 750 comprises links 761, 762, 771, 772, 773, 774 for communication to and from each single module element, said links being integrated into the support member 750.

According to this embodiment the module system comprises a support member 750 and seven interconnected hexagonal module elements 500 arranged on top of the support member 750 in such a way that a left column of two module elements 500, an intermediate column of three module elements 500 and a right column of two module elements 500 is formed. One hexagonal module element is thus arranged in the middle and the other six are arranged around the middle module element on the support member 750.

According to this embodiment current supply signals and communication signals are separated and not superposed, which results in the communication bandwidth being increased, thus speeding up the communication rate. This simplifies change in signature patterns due to the increased bandwidth increasing the signal speed of the communication signals. Hereby also thermal adaptation during movement is improved.

By having current signals and communication signals separated interconnection of a large number of module elements 500 without affecting the communication speed is facilitated. Each support member 750 comprises several links 771, 772, 773, 774 for digital and/or analogue signals in combination with two or more links 761, 762 for current supply.

According to this embodiment said integrated links comprises a first link 761 and a second link 762 for supply of current to each column of module elements 500. Said integrated links further comprises third and fourth links 771, 772 for information/communication signals to the module elements 500, said signals being digital and/or analogue, and fifth and sixth links 773, 774 for information/diagnostic signals from the module elements 500, said signals being digital and/or analogue.

By having two links, third and fourth links 771, 772, for providing information signals to the module elements 500 and two links, fifth and sixth links 773, 774, for providing information signals from the module elements 500 the communication speed becomes essentially unlimited, i.e. occurs momentarily.

The support module is connectable to other support modules of this kind, the support modules being connected via connectors (not shown), e.g. similar to connectors referred to with reference to FIG. 7a, for electrically engaging the support modules via the links. Hereby the number of connectors are reduced.

The module elements 500 are attached to the support member 750 by means of any suitable fastening means.

Interconnected support members 750 forming a support structure are intended to be arranged on the body of a craft such as a vehicle, a ship or the like.

A temperature sensing means 210 according to e.g. FIG. 6 is arranged in connection to the thermoelectric element 150 of respective module element 500 to sense the outer temperature of that module element 500. The outer temperature is then arranged to be continuously compared with background temperature sensed by means of the thermal sensing means such as described above in connection to FIG. 5 and FIG. 6. When these differ, means such as a temperature control loop described in connection to FIG. 6, arranged to regulate the voltage to the thermoelectric element of the module element such that actual values and desired values correspond. The degree of signature efficiency of the system, i.e. the degree of thermal adaptation that may be achieved, depends on which thermal sensing means, i.e. which temperature reference, that is used—temperature sensor, IR-sensor or IR-camera.

As a result of the thermal sensing means according to an embodiment being constituted by at least one temperature sensor such as a thermometer arranged to measure the temperature of the ambient air, a less precise representation of the background temperature, but a temperature sensor has the advantage that it is cost efficient. In application with vehicles or the like temperature sensor is preferably arranged in air intake of the vehicle in order to minimize influence of heated areas of the vehicle.

As a result of the thermal sensing means according to an embodiment being constituted by at least one IR-sensor arranged to measure the apparent temperature of the background, i.e. arranged to measure an average value of the background temperature a more correct value of the background temperature is achieved. IR-sensor is preferably placed on all sides of a vehicle in order to cover different directions of threat.

As a result of the thermal sensing means according to an embodiment being constituted by an IR-camera arranged to sense the thermal structure of the background, an almost perfect adaptation to the background may be achieved, the temperature variations of a background being representable on e.g. a vehicle. Here, a module element 500 will correspond to the temperature which the set of pixels occupied by the background at the distance in question. Theses camera pixels are arranged to be grouped such that the resolution of the IR-camera corresponds to the resolution being representable by the resolution of the module system, i.e. that each module element correspond to a pixel. Hereby a very good representation of the background temperature is achieved such that e.g. heating of the sun, snow stains, water pools, different emission properties etc. of the background often having another temperature than the air may be correctly represented. This efficiently counteracts that clear contours and large evenly heated surfaces are created such that a very good thermal camouflaging of the vehicle is facilitated and that temperature variations on small surfaces may be represented.

Figure 8:
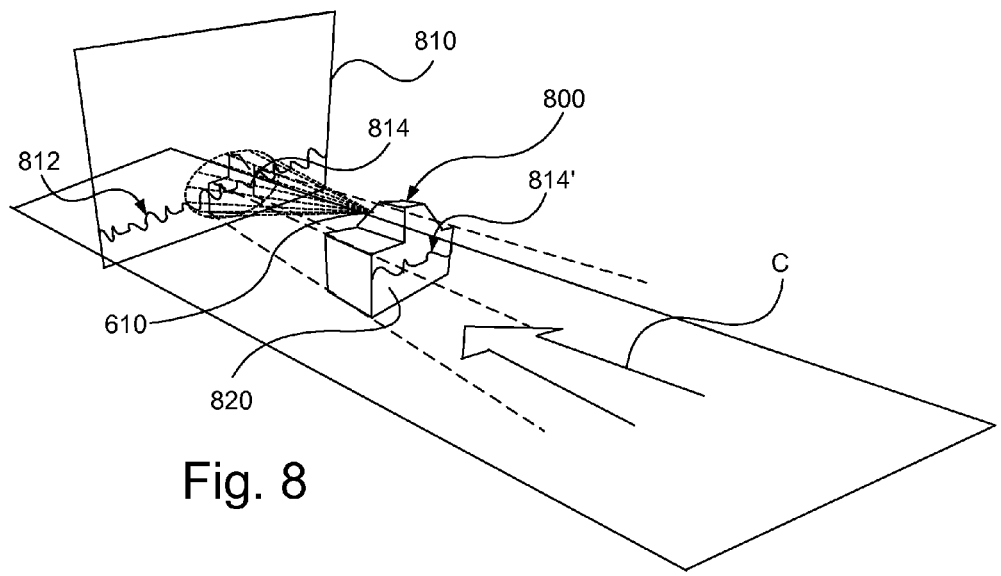
FIG. 8 schematically illustrates an object such as a vehicle subjected to a threat in a direction of threat, the background of the thermal structure being recreated on the side of the vehicle facing in the direction of threat.

FIG. 8 schematically illustrates an object 800 such as a vehicle 800 subjected to threat in a direction of threat, the thermal structure 812 of the background 810 being recreated on the side of the vehicle facing the direction of threat by means of a device according to the present invention. The device according to an embodiment comprises the module system according to FIG. 7a-c or FIG. 7d-e, the module system being arranged on the vehicle 800.

The estimated direction of threat is illustrated by means of the arrow C. The object 800, e.g. a vehicle 800, constitute a target. The threat may e.g. be constituted by a thermal reconnaissance and surveillance system, a heat seeking missile or the corresponding arranged to lock on the target.

Seen in the direction of threat a thermal background 810 is present in the extension of the direction C of threat. The part 814 of this thermal background 810 of the vehicle 800 being viewed from the threat is arranged to be copied by means of a thermal sensing means 610 according to the invention such that a copy 814' of that part of the thermal background, according to a variant the thermal structure 814', is viewed by the threat. As described in connection to FIG. 7a-e the thermal sensing means 610 according to a variant comprises an IR-camera, according to a variant an IR-sensor and a variant a temperature sensor, where IR-camera provides the best thermal representation of the background.

The thermal background 814', thermal structure of the background sensed/copied by means of the thermal sensing means, is arranged to be interactively recreated on the side of the target, here vehicle 800, facing the threat, by means of the device, such that the vehicle 800 thermally melt into the background. Hereby the possibility for detection and identification from threats, e.g. in the form of IR-cameras or a heat seeking missile locking at the target/vehicle 800 is rendered more difficult since it thermally melts into the background.

As the vehicle moves the copied thermal structure 814' of the background will continuously be adapted to changes in the thermal background due to the combination of heat conducting layers with anisotropic heat conductibility, insulation layer, thermoelectric element and continuously registered difference between thermal sensing means for sensing of thermal background and temperature sensing means according to any of the embodiments of the device according to the present invention.

The device according to the present invention consequently facilitates automatic thermal adaptation and lower contrast to temperature varying backgrounds, which renders detection, identification and recognition more difficult and reduces threat from potential target seekers or corresponding.

The device according to the present invention facilitates a low signature of a vehicle, i.e. Low contrast, such that the contours of the vehicle, placement of exhaust outlet, placement and size of outlet of cooling air, track stand or wheels, canon, etc., i.e. the signature of the vehicle may be thermally minimized such that a lower thermal signature against a background is provided by means of the device according to the present invention.

The device according to the present invention with a module system according to e.g. FIG. 7a-c or FIG. 7d-e offers an efficient layer of thermal isolation, which lowers the power consumption of e.g. AC-systems with lower affection of solar heating, i.e. when the device is not active the module system provides a good thermal isolation to solar heating of the vehicle and thereby improves the internal climate.

Further multispectral properties, i.e. camouflage in different wave ranges, are facilitated. The module elements 500 may, apart from thermally, also provide low signature for certain predetermined parts of the radar range. This is created by applying different types of thin, radar absorbing layers to the module elements 500. Choice of layer type determines which part of the radar spectra to be absorbed. Radar absorbents are standard products today and can be very thin layers.

Figure 9:
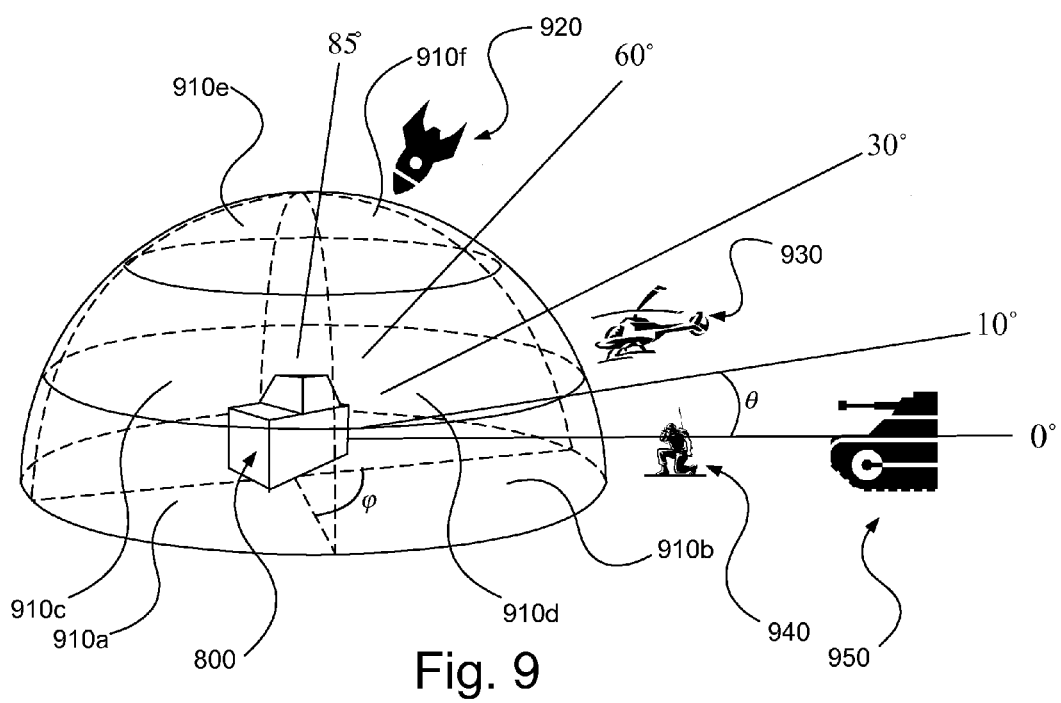
FIG. 9 schematically illustrating different potential directions of threat for an object such as a vehicle equipped with a device for recreating of the thermal structure of a desired background.

FIG. 9 schematically illustrates different potential directions of threat for an object 800 such as a vehicle 800 equipped with a device according to an embodiment of the invention for recreation of the thermal structure of desired background.

According to an embodiment of the device according to the invention the device comprises means for choosing different direction of threats. The means according to an embodiment comprises a user interface e.g. as described in connection to FIG. 6. Depending on the expected direction of threat, the IR-signature will need to be adapted to different backgrounds. The user interface 630 in FIG. 6 according to an embodiment constitute graphically a way for the user to easily be able to choose from an estimated direction of threat which part or parts of the vehicle that needs/need to be active in order to keep a low signature to the background.

By means of the user interface the operator may choose to focus available power of the device to achieve the best conceivable thermal structure/signature, which e.g. may be required when the background is complicated and demanding much power of the device for an optimal adaptation.

FIG. 9 shows different directions of threat for the object 800/vehicle 800, the directions of threat being illustrated by having the object/vehicle drawn in a semi-sphere divided into sections. The threat may be constituted by e.g. threat from above such as target seeking missile 920, helicopter 930, or the like or from the ground such as from soldier 940, tank 950 or the like. If the threat comes from above the temperature of the vehicle should coincide with the temperature of the ground, while it should be adapted to the background behind the vehicle should the threat be coming straight from the front in horizontal level. according to a variant of the invention a number of threat sectors 910a-f defined, e.g. twelve threat sectors, of which six 910a-f are referred to in FIG. 9 and an additional six are opposite of the semi-sphere, which may be chosen by means of the user interface.

Above the device according to the present invention has been described where the device is utilized for thermal camouflaging such that e.g. a vehicle during movement continuously by means of the device according to the invention quickly adapts itself thermally to the background, the thermal structure of the background being copied by means of a thermal sensing means such as an IR-camera or an IR-sensor.

The device according to the present invention may advantageously be used for generating specific thermal patterns. This is achieved according to a variant by resulting each thermoelectric element of a module system built up of module elements e.g. as illustrated in FIG. 7a-c or FIG. 7d-e such that the module elements receives desired, e.g. different, temperature, any desired thermal pattern may be provided. Hereby a pattern which only may be recognized by the one knowing its appearance may be provided such that in a war situation identification of own vehicles or corresponding is facilitated while the enemy can not identify the vehicle. Alternatively a pattern known by anyone may be provided by means of the device according to the invention, such as a cross so that everybody may identify an ambulance vehicle in the dark.

According to yet another variant the device according to the present invention may be used for generating a false signature of other vehicles for e.g. infiltration of the enemy. This is achieved by regulating each thermoelectric element of a module system built up of module elements e.g. as illustrated in FIG. 7a-c or FIG. 7d-e such that the right contours of a vehicle, evenly heated surfaces, cooling air outlet or other types of hot areas being unique for the vehicle in question are provided. Hereby information regarding this appearance is required.

Further, thermal patterns in the form of e.g. a collection of stones, grass and stone, different types of forest, city environment (edgy and straight transitions) could be provided by means of the device according to the invention, which patterns could look like patterns being in the visible area. Such thermal patterns are independent of direction of threat and are relatively cheap and simple to integrate.

For the above mentioned integration of specific patterns according to a variant no thermal sensing means is required, but is sufficient to regulate the thermoelectric elements, i.e. apply voltage corresponding to desired temperature for desired pattern of respective module element and temperature sensing means for being able to read the present temperature and maintain this.

Figure 10:
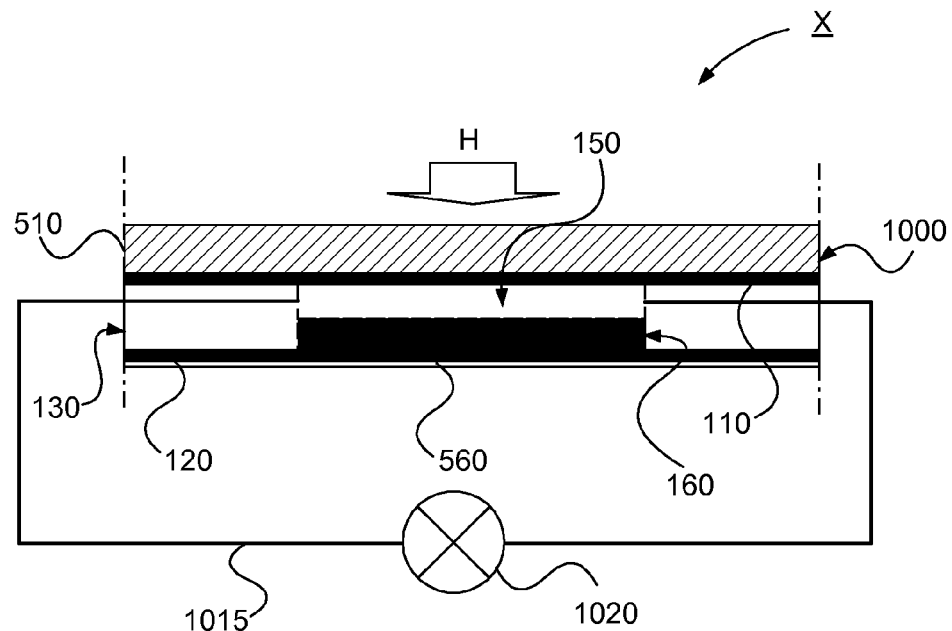
FIG. 10 schematically illustrates a view of different layers of a device according to an embodiment of the present invention.

An additional possibility with the device according to the present invention is production of electric current. FIG. 10 schematically illustrates a view of different layers of a device X according to an exemplary embodiment of the present invention utilizing a module element 1000 for production of electric current. The module element 1000 is arranged to receive heat illustrated by the arrow H.

The module element 1000 comprises the outer layer 510, the first heat conducting layer 110, the second heat conducting layer 120, said first and second heat conducting layer 110, 120 being mutually heat isolating by means of the intermediate insulation layer 130, and the thermoelectric element 150 arranged so as to generate electric current through the Seebeck effect, i.e. the temperature difference sensed by the thermoelectric element 150 is converted into electricity. Thus a temperature difference is arranged to be converted into electrical power by means of said thermoelectric element (150) utilizing the Seebeck effect.

The module element 1000 further comprises according to this variant the thermal membrane 560 arranged underneath the second heat conducting layer 120 for providing good thermal contact between the second heat conducting layer 120 and the underlying surface in accordance with the text above referring to FIG. 5a. The device further comprises a link 1015 for providing said produced current to a desired energy receiving means 1020.

The thermoelectric element 150 is by means of the Peltier effect arranged to drive heat from one side to another of the same by applying a voltage to the thermoelectric element and thus supplying a current on the same. The transport of heat results in transportation of electrons in among others the heat conducting layers 110, 120.

When the voltage over the thermoelectric element 150 is disconnected there is a temperature difference between the heat conducting layers, e.g. the first heat conducting layer and the second heat conducting layer according to the embodiment described in connection to FIG. 5a. By this temperature difference a current arises, the so called Seebeck effect. This current is than utilized via the link 1015 for providing energy to e.g. charging a battery 1020 or the like. The efficiency is here affected by the semi-conductors of the thermoelectric elements 150. The larger the temperature difference the more current may be obtained.

There are a number of areas of application for a device according to the present invention by e.g. using the efficient removal of heat being facilitated. E.g. the device according to the present invention may advantageously be used for e.g. a cooling bag where a device according to the present invention efficiently would be able to disperse the cold, voltage applied over the thermoelectric element advantageously being provided by means of a battery and where voltage may be switched on and off by means of a switch.

The device may also be used in cooling of electronic components, e.g. for cooling of processors, where heat from large surfaces may be diverted efficiently by means of the device according to the present invention and thus, efficient cooling may be provided.

The device according to the present invention may also be used during calibration of an IR-camera in order to achieve stable temperature references. By means of the device according to the invention a very even current may be maintained. This may be used in different laser systems where the wavelength is controlled by either heating of the laser in the case of diode laser and the cavity in the case of external cavity lasers.

Due to the fact that the surface element according to the present invention is pressure insensitive to a certain degree and may be dimensioned relatively small the device may advantageously be arranged in e.g. the soles of shoes, e.g. for heating in winter shoes/during cold to avoid freezing of the feat or cooling in summer shoes/during heat to avoid sweating of the feat.

Further, very silent systems may be accomplished in e.g. laptop due to the thermoelectric element.

The device may further be utilized for heating of seats, cooling of seats of a vehicle such as a car, wherein e.g. a battery is used for supply of voltage to the thermoelectric element and a temperature regulator for regulating the temperature, i.e. the voltage over the thermoelectric element.

As described above, the device facilitates thermal barriers by composition of module elements such that different temperatures may be maintained on different surfaces.

Figure 11:
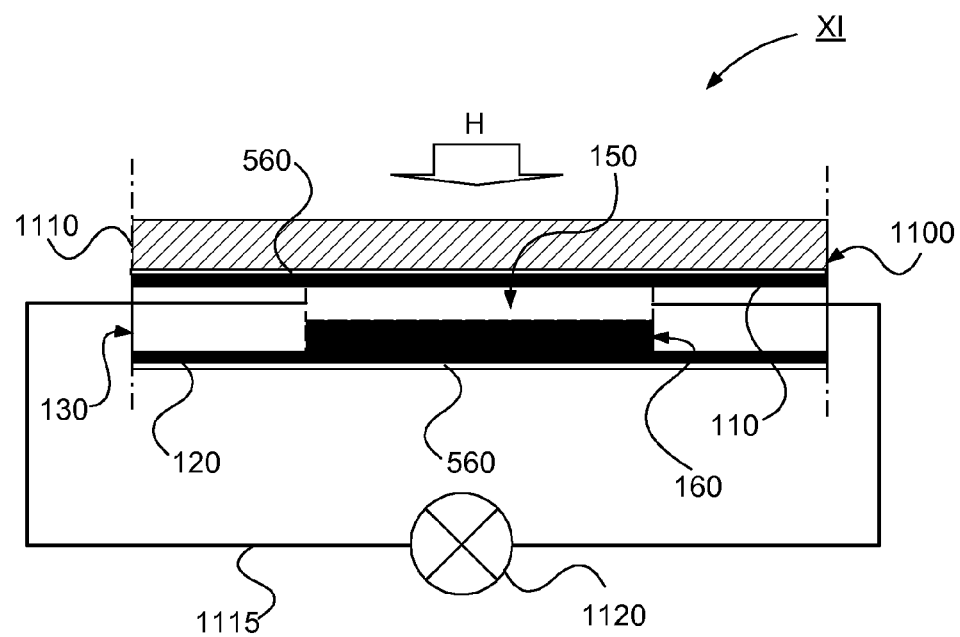
FIG. 11 schematically illustrates a view of different layers of a device according to an embodiment of the present invention.

The device may also advantageously be used in combination with solar cells for rendering use of solar energy more efficient, the device making use of parts of the excessive heat formed. FIG. 11 schematically illustrates a view of different layers of a device XI according to an exemplary embodiment of the present invention utilizing a module element 1100 in combination with a solar cell 1110. The device XI thus comprises a solar cell 1110 being arranged outermost at the module element 1100 for receiving heat illustrated by the arrow H.

The module element 1100 comprises the first heat conducting layer 110, the second heat conducting layer 120, said first and second heat conducting layers 110, 120 being mutually heat isolating by means of the intermediate insulation layer 130, and the thermoelectric element 150 arranged so as to generate electric current through the Seebeck effect, i.e. the temperature difference sensed by the thermoelectric element 150 is converted into electricity. Thus a temperature difference is arranged to be converted into electrical power by means of said thermoelectric element (150) utilizing the Seebeck effect.

The module element 1100 further comprises according to this variant the thermal membrane 560 arranged underneath the second heat conducting layer 120 in order to provide good thermal contact between the second heat conducting layer 120 and an underlying surface, and between the first heat conducting layer 110 and the solar cell 1110 in order to provide good thermal contact there between.

The solar cell 1110 is arranged to generate electricity by means of the photoelectric effect at the same time as the underlying thermoelectric element is arranged to generate electricity by converting the temperature difference between the first and second heat conducting layers 110, 120. The device therefore further comprises a link 1115 for providing a current produced by means of the module element 1100 for energizing a desired energy receiving means.

The module elements 1100 are thus arranged to lie under a solar cell 1110 and by means of the current arising from the temperature difference due to the Seebeck effect as described above a small part of the excessive heat may be converted to useful energy.

The device also relates to an object to which a device according to the invention may be arranged. The object is according to an embodiment a craft such as a vehicle, a plane, a boat or the corresponding. The object may also be any kind of suitable object where the device may be arranged for cooling or heating according to above, such as e.g. cooling bag, electronic component, laptop, shoes, seat etc.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated.

The invention claimed is:

1. A device for thermal adaptation to provide thermal camouflage, the device comprising:
   a surface element arranged to assume a determined thermal distribution, said surface element comprising a first heat conducting layer, a second heat conducting layer, said first and second heat conducting layer being mutually thermally isolated by an intermediate insulation layer that comprises a vacuum based element; and
   a thermoelectric element arranged to generate a predetermined temperature gradient to a portion of said first layer so that the surface element assumes the determined thermal distribution so as to provide the thermal camouflage.

2. The device according to claim 1, wherein the vacuum based element is covered with high reflection membranes.

3. The device according to claim 1, wherein a pressure in the vacuum based element lies in the range of 0.005 to 0.01 torr.

4. The device according to claim 1, wherein the insulation layer comprises a combination of the vacuum based element and low emissive layers arranged in a sandwich construction.

5. The device according to claim 1, wherein said first layer and said second layer have anisotropic heat conduction such that heat conduction mainly occurs in a direction crosswise to a thickness direction of the surface element.

6. The device according to claim 1, wherein said first layer and/or said second layer is composed of graphite with anisotropic properties.

7. The device according to claim 1, wherein the thermoelectric element is arranged in the insulation layer.

8. The device according to claim 1, further comprising an intermediate heat conducting element arranged in the insulation layer between the thermoelectric element and the second heat conducting layer, and has anisotropic heat conduction such that heat conduction mainly occurs along a thickness direction of the surface element.

9. The device according to claim 1, wherein the surface element has a hexagonal shape.

10. The device according to claim 1, further comprising:
a rigid support layer, arranged inwardly of the second heat conducting layer, configured to support the surface element,
a third heat conducting layer in a shape of a heat pipe/heat plate arranged, inwardly of the support layer, configured to divert heat from the second heat conducting layer.

11. The device according to claim 10, wherein the third heat conducting layer comprises sealed aluminum or copper with internal capillary surfaces in a shape of wicks.

12. The device according to claim 11, wherein the wicks are saturated with liquid.

13. The device according to claim 1, further comprising a temperature sensing device arranged to sense outer temperature of the surface element, a thermal sensing device arranged to sense the surrounding temperature, and a control unit connected to the temperature sensing device, the thermal sensing device and the thermoelectric element so as to receive temperature data and control the thermoelectric element.

14. The device according to claim 13, wherein said thermal sensing device comprises an IR-camera.

15. The device according to claim 13, wherein the control unit is arranged to determine a temperature difference between the surrounding temperature and the outer temperature of the surface element so as to provide said generated temperature gradient based upon said difference.

16. The device according to claim 1, further comprising a support structure comprising frames arranged to receive and support the surface element, wherein the support structure itself is arranged to supply electric current to electrically engage the surface element such that no wires are needed for supply of current to the surface element.

17. The device according to claim 1, wherein the surface element comprises radar radiation absorbing layers to provide low signature.

18. An object comprising a device according to claim 1.

* * * * *